United States Patent
Li et al.

(10) Patent No.: US 12,424,282 B2
(45) Date of Patent: Sep. 23, 2025

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Haoyu Li, Boise, ID (US); John D. Hopkins, Meridian, ID (US); Collin Howder, Boise, ID (US); Adam W. Saxler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 597 days.

(21) Appl. No.: 17/752,207

(22) Filed: May 24, 2022

(65) Prior Publication Data
US 2023/0386575 A1 Nov. 30, 2023

(51) Int. Cl.
*G11C 16/04* (2006.01)
*H10B 41/10* (2023.01)
(Continued)

(52) U.S. Cl.
CPC ......... *G11C 16/0483* (2013.01); *H10B 41/10* (2023.02); *H10B 41/27* (2023.02); *H10B 43/10* (2023.02); *H10B 43/27* (2023.02)

(58) Field of Classification Search
CPC ........ H10B 43/27; H10B 41/27; H10B 43/10; H10B 41/10
See application file for complete search history.

(56) References Cited

U.S. PATENT DOCUMENTS 6,162,737 A 12/2000 Weimer et al.
6,586,814 B1 7/2003 Patei et al.
(Continued)

FOREIGN PATENT DOCUMENTS

TW 201707193 2/2017
TW 202119605 5/2021

OTHER PUBLICATIONS

Hopkins et al., U.S. Appl. No. 17/475,057, filed Sep. 14, 2021, titled "Memory Arrays Comprising Strings of Memory Cells and Methods Used in Forming a Memory Array Comprising Strings of Memory Cells", 52 pages.
(Continued)

*Primary Examiner* — Amar Movva
(74) *Attorney, Agent, or Firm* — Wells St. John P.S.

(57) ABSTRACT

A memory array comprising strings of memory cells comprises a conductor tier comprising conductor material. Laterally-spaced memory blocks individually comprise a vertical stack comprising alternating insulative tiers and conductive tiers. Channel-material strings of memory cells extend through the insulative tiers and the conductive tiers. Conducting material of a lower of the conductive tiers directly electrically coupling together the channel material of individual of the channel-material strings and the conductor material of the conductor tier. The conducting material in the lower conductive tier comprises upper conductively-doped semiconductive material, lower conductively-doped semiconductive material, and intermediate material vertically there-between. The intermediate material is of different composition from those of the upper conductively-doped semiconductive material and the lower conductively-doped semiconductive material and comprises at least one of carbon, nitrogen, oxygen, metal, and n-type doped material
(Continued)

also comprising boron. Other embodiments, including method, re disclosed.

32 Claims, 17 Drawing Sheets

(51) Int. Cl.
*H10B 41/27* (2023.01)
*H10B 43/10* (2023.01)
*H10B 43/27* (2023.01)

(56) References Cited

U.S. PATENT DOCUMENTS

| | | | |
|---|---|---|---|
| 9,356,043 B1 | 5/2016 | Sakakibara et al. |
| 9,824,966 B1 | 11/2017 | Kanakamedala et al. |
| 10,256,252 B1 | 4/2019 | Kanazawa |
| 10,522,562 B2 | 12/2019 | Kim et al. |
| 10,770,476 B1 | 9/2020 | Chung et al. |
| 10,854,627 B1 | 12/2020 | Moriyama et al. |
| 11,056,505 B2 | 7/2021 | Hopkins et al. |
| 2005/0287777 A1 | 12/2005 | Morino et al. |
| 2009/0140312 A1 | 6/2009 | Nishihara |
| 2010/0255664 A1 | 10/2010 | Khandekar et al. |
| 2014/0261685 A1 | 9/2014 | Liao |
| 2015/0000743 A1 | 1/2015 | Miyamichi |
| 2015/0104916 A1 | 4/2015 | Lee et al. |
| 2015/0255481 A1 | 9/2015 | Baenninger et al. |
| 2015/0255482 A1 | 9/2015 | Takahashi |
| 2015/0279857 A1 | 10/2015 | Kim et al. |
| 2016/0043093 A1 | 2/2016 | Lee et al. |
| 2016/0155829 A1 | 6/2016 | Karda et al. |
| 2017/0110470 A1 | 4/2017 | Rabkin et al. |
| 2017/0148810 A1 | 5/2017 | Kai et al. |
| 2017/0373089 A1 | 12/2017 | Kim et al. |
| 2018/0006052 A1 | 1/2018 | Hwang |
| 2018/0122904 A1 | 5/2018 | Matsumoto et al. |
| 2019/0288000 A1 | 9/2019 | Choi |
| 2019/0333931 A1 | 10/2019 | Jung et al. |
| 2020/0083246 A1 | 3/2020 | Inatsuka |
| 2020/0161131 A1 | 5/2020 | Guo et al. |
| 2020/0168629 A1 | 5/2020 | Kang |
| 2020/0235112 A1 | 7/2020 | Howder et al. |
| 2020/0303391 A1 | 9/2020 | Tang et al. |
| 2020/0411536 A1 | 12/2020 | Kim et al. |
| 2021/0005455 A1 | 1/2021 | Wang et al. |
| 2021/0028282 A1 | 1/2021 | Kumar et al. |
| 2021/0193675 A1 | 6/2021 | Howder et al. |
| 2021/0202539 A1 | 7/2021 | Cai |
| 2021/0288069 A1 | 9/2021 | Chae et al. |
| 2021/0358940 A1 | 11/2021 | Wang |
| 2021/0366808 A1 | 11/2021 | Cui et al. |
| 2021/0408031 A1 | 12/2021 | Sharangpani et al. |
| 2022/0246636 A1 | 8/2022 | Tobioka et al. |
| 2023/0240070 A1 | 7/2023 | Funayama et al. |

OTHER PUBLICATIONS

Hopkins et al., U.S. Appl. No. 17/674,219, filed Feb. 17, 2022, titled "Memory Arrays Comprising Strings of Memory Cells and Methods Used in Forming a Memory Array Comprising Strings of Memory Cells", 54 pages.

Hopkins et al., U.S. Appl. No. 17/746,404, filed May 17, 2022, titled "Memory Arrays Comprising Strings of Memory Cells and Methods Used in Forming a Memory Array Comprising Strings of Memory Cells", 45 pages.

Hopkins et al., U.S. Appl. No. 17/830,108, filed Jun. 1, 2022, titled "Memory Arrays Comprising Strings of Memory Cells and Methods Used in Forming a Memory Array Comprising Strings of Memory Cells", 50 pages.

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
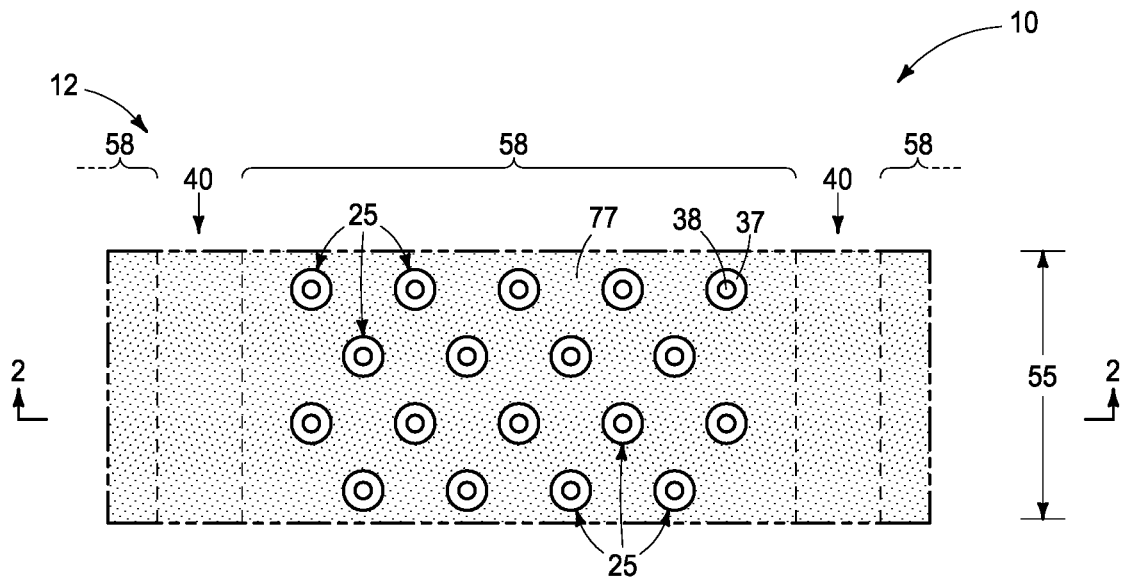
FIGS. 1-4 are diagrammatic cross-sectional views of portions of a construction that will comprise an array of elevationally-extending strings of memory cells in accordance with an embodiment of the invention.
Figure 2:
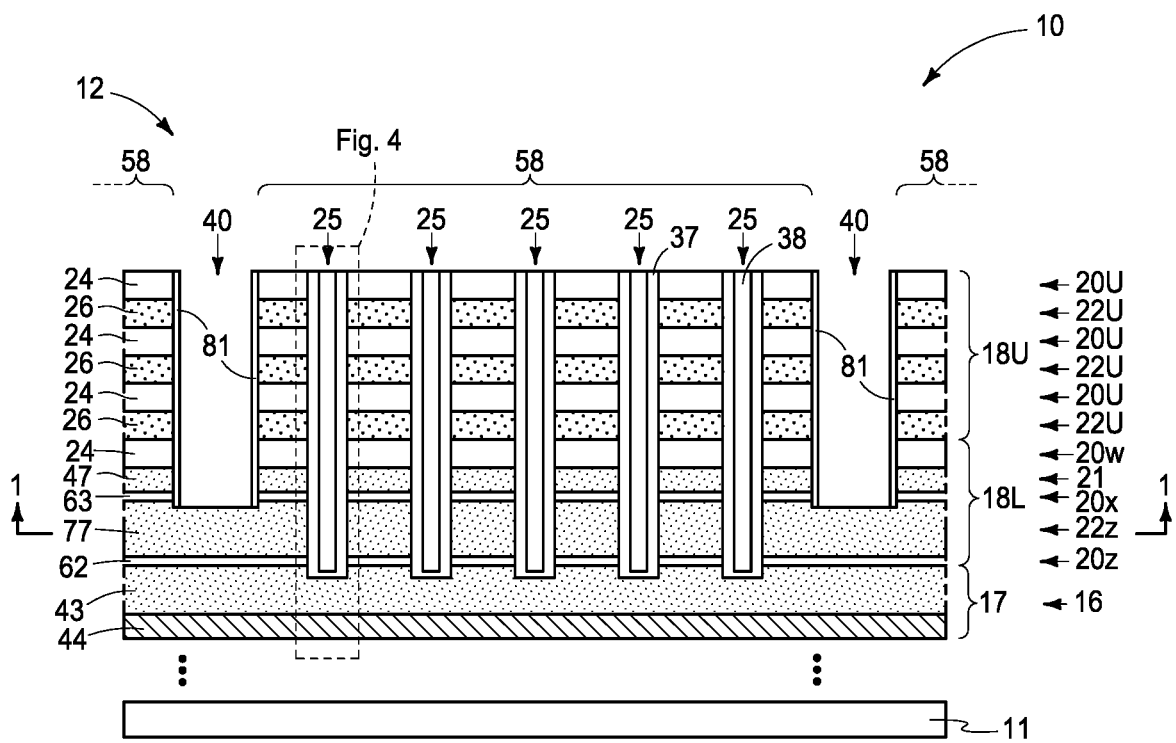
Figure 3:
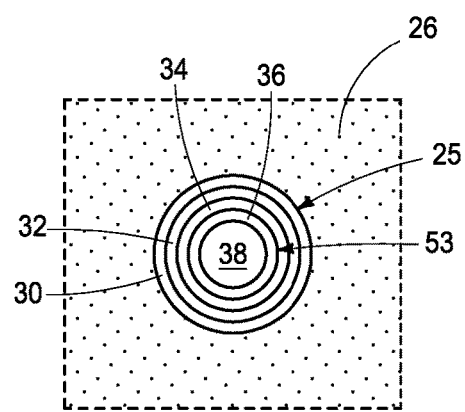
Figure 4:
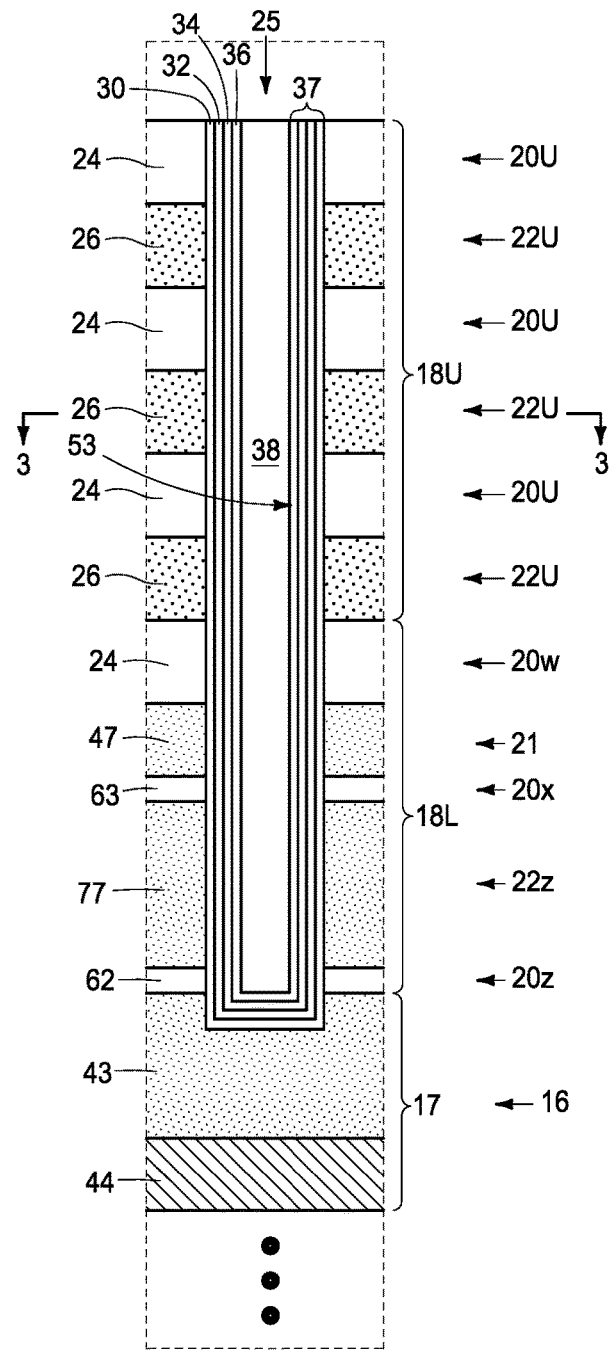

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry comprising a memory array comprising strings of memory cells (e.g., NAND architecture) independent of method of manufacture. First example method embodiments are described with reference to FIGS. 1-21.

FIGS. 1-4 show an example construction 10 having an array 12 in which elevationally-extending strings of transistors and/or memory cells will be formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-4-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as WSi$_x$). Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, unless otherwise indicated, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Example lowest second tier 20z is insulative and may be sacrificial (e.g., comprising material 62, for example silicon dioxide and/or silicon nitride). A next-lowest second tier 20x of second tiers 20* is directly above lowest second tier 20z and may be sacrificial (e.g., comprising material 63, for example silicon dioxide and/or silicon nitride). In some embodiments, a lowest tier 22z of first tiers 22* comprising sacrificial material 77 (e.g., polysilicon or silicon nitride) is vertically between lowest second tier 20z and next-lowest second tier 20x. In one embodiment, lower portion 18L comprises a conducting-material tier 21 comprising conducting material 47 (e.g., conductively-doped polysilicon) that is directly above next-lowest second tier 20x. Example lower portion 18L comprises an upper second tier 20w (e.g., a next-next lowest second tier) comprising insulative material 24 (e.g., silicon dioxide). Additional tiers may be present. For example, one or more additional tiers may be above tier 20w (tier 20w thereby not being the uppermost tier in portion 18L, and not shown), between tier 20w and tier 21 (not shown), and/or below tier 22z (other than 20z not being shown). In one embodiment, lower portion 18L at least as initially formed comprises multiple first/conductive tiers (e.g., 22z and 21) tiers and multiple second/insulative tiers (e.g., 20z, 20x, 20w).

Vertically-alternating first tiers 22U and second tiers 20U of an upper portion 18U of stack 18* have been formed above lower portion 18L. Material 26 of first tiers 22U is sacrificial (e.g., silicon nitride; in some embodiments referred to as sacrificial material) and of different composition from material 24 of second tiers 20U (e.g., silicon dioxide). First tiers 22U may be conductive and second tiers 20U may be insulative (e.g., comprising silicon dioxide 24), yet need not be so at this point of processing in conjunction with the hereby initially-described example method embodiment which is "gate-last" or "replacement-gate". Example upper portion 18U is shown starting above lower portion 18L with a first tier 22U although such could alternately start with a second tier 20U (not shown). Further, and by way of example, lower portion 18L may be formed to have one or more first and/or second tiers as a top thereof. Regardless, only a small number of tiers 20U and 22U is shown, with more likely upper portion 18U (and thereby stack 18*) comprising dozens, a hundred or more, etc. of tiers 20* and 22*. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through second tiers 20* and first tiers 22* in upper portion 18U to lower portion 18L (e.g., at least to lowest first tier 22z in lower portion 18L). Channel openings 25 may taper radially-inward and/or radially-outward (not shown) moving deeper into stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Horizontally-elongated trenches 40 have been formed (e.g., by anisotropic etching) into stack 18* and that are individually between immediately-laterally-adjacent memory-block regions 58. Trenches 40 individually extend through upper portion 18L to lowest first tier 22z and expose sacrificial material 77 therein. A sacrificial etch-stop line (not shown) having the same general horizontal outline as trenches 40 may individually be formed in a lower portion of stack 18* prior to forming trenches 40. Trenches 40 may then be formed by etching materials 24 and 26 to stop on or within the material of the individual sacrificial lines, followed by exhuming remaining material of such sacrificial lines. An optional thin sacrificial liner 81 (e.g., hafnium oxide, aluminum oxide, multiple layers of the same or other materials, [e.g., silicon dioxide and silicon nitride] etc.) has then be formed in trenches 40, followed by punch-etching there-through to expose material 77. Trenches 40 may taper laterally-inward or laterally-outward moving deeper into stack 18* (not shown). By way of example and for brevity only, channel openings 25 are shown as being arranged in groups or columns of staggered rows of four and five channel openings 25 per row. Trenches 40 will typically be wider than channel openings 25 (e.g., 3 to 10 times wider). Any alternate existing or future-developed arrangement and construction may be used. Trenches 40 and channel openings 25 may be formed in any order relative the other or at the same time.

Figure 5:
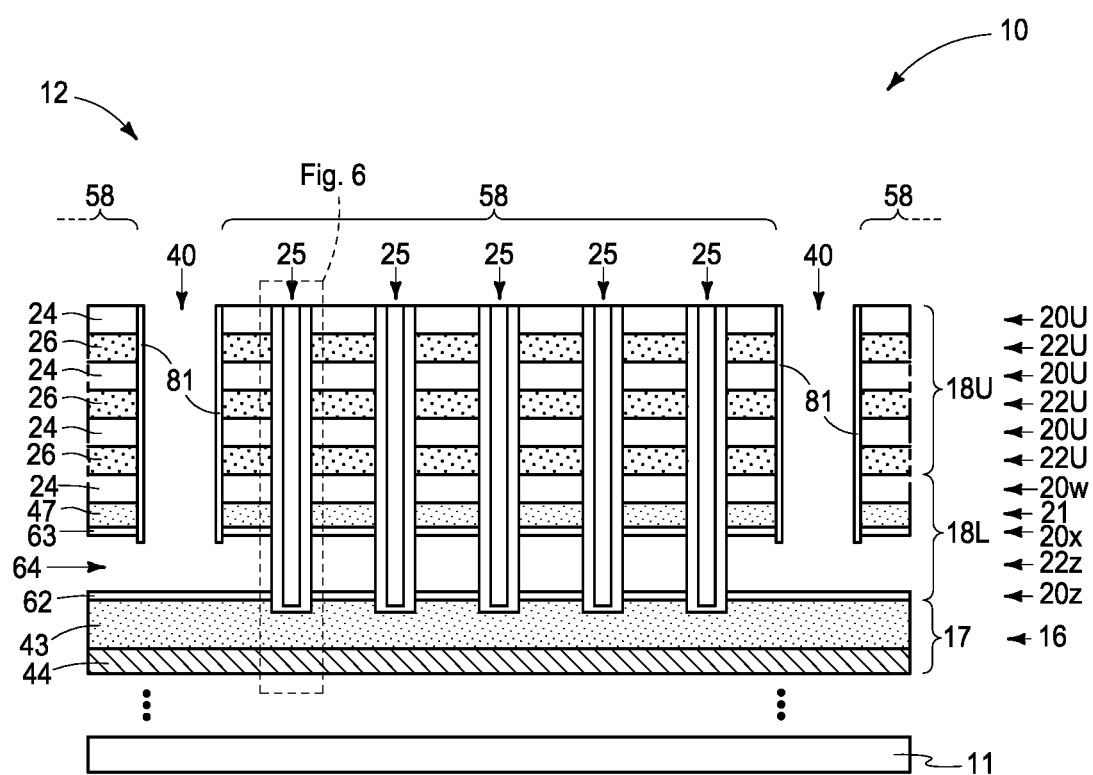
FIGS. 5-21 are diagrammatic sequential sectional and/or enlarged views of the construction of FIGS. 1-4, or portions thereof or alternate and/or additional embodiments, in process in accordance with some embodiments of the invention.
Figure 6:
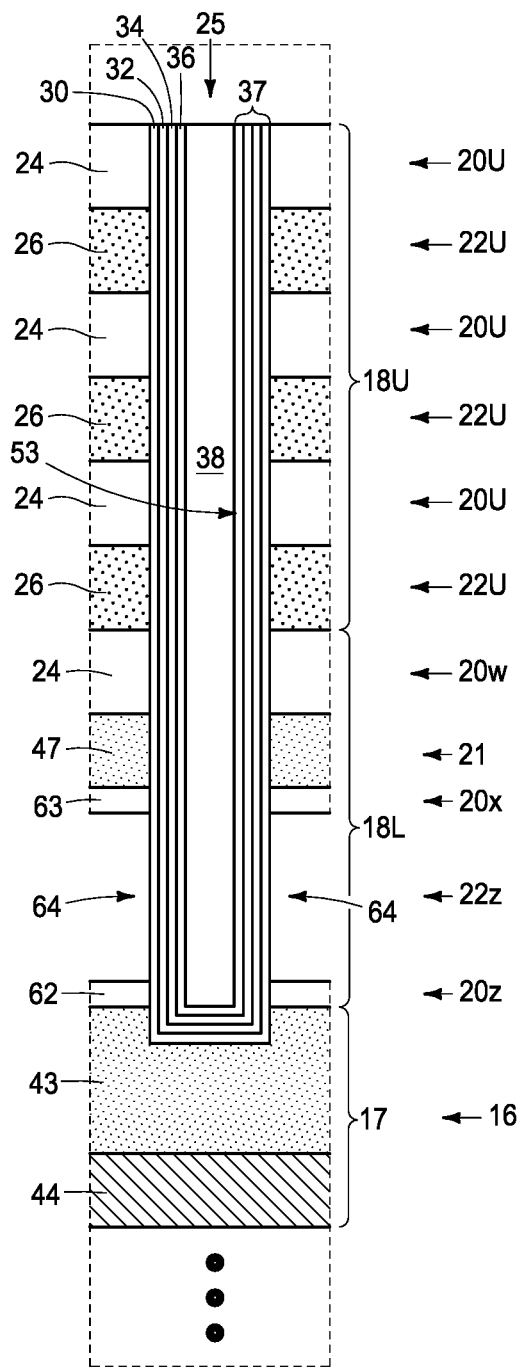

Referring to FIGS. 5 and 6, sacrificial material 77 (not shown) has been removed (e.g., by isotropic etching) from lowest first tier 22z through trenches 40, thus leaving or forming a void-space 64 vertically between lowest second tier 20z and next-lowest second tier 20x. Such may occur, for example, by isotropic etching that is ideally conducted selectively relative to materials 62 and 63, for example using liquid or vapor $H_3PO_4$ as a primary etchant where material 77 is silicon nitride or using tetramethyl ammonium hydroxide [TMAH] where material 77 is polysilicon.

Figure 7:
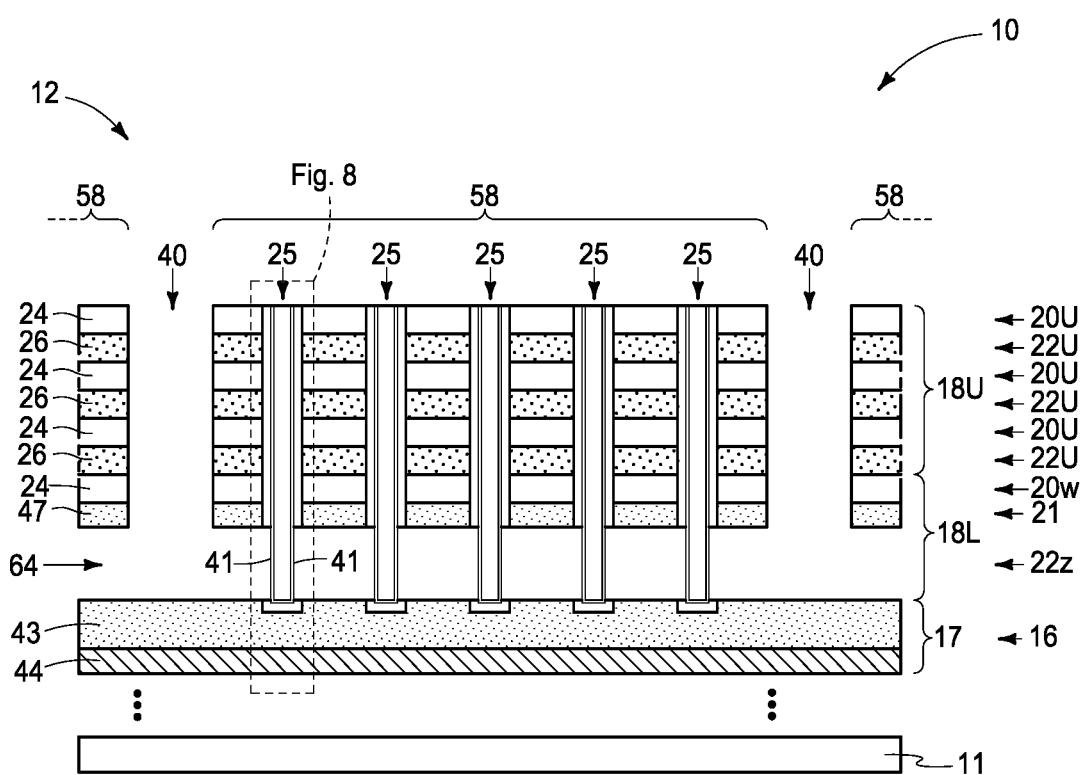
Figure 8:
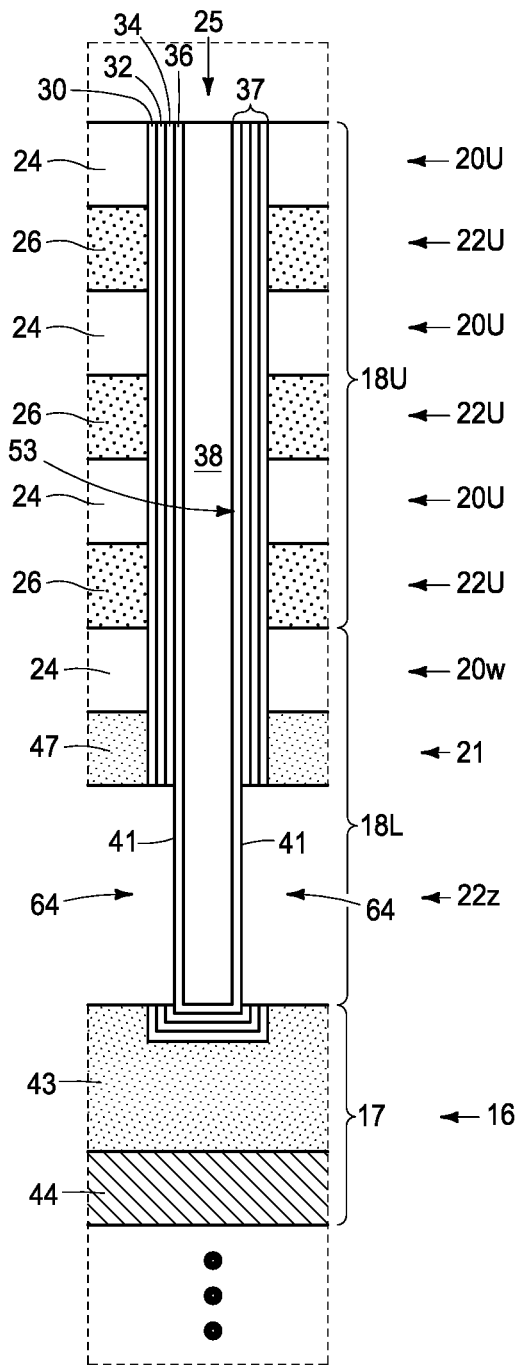

FIGS. 7 and 8 show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 81 (not shown) is one or more insulative oxides (other than solely silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment, such etching may be conducted selectively relative to liner 81 (when present, and liner 81 not being shown). In one embodiment and as shown, materials 62 and 63 (not shown) have been removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired. If liner 81 (not shown) comprises multiple layers of silicon dioxide and silicon nitride, such may be removed (e.g., by etching) commensurate with removal of materials 30, 32, 34, 62, and 63 where such collectively comprise silicon nitride and silicon dioxide. Alternately, liner 81 may remain at this point of processing (not shown) or be separately or otherwise removed.

Conducting material is formed in a lower of the first tiers (e.g., the lowest first tier) that directly electrically couples together the channel material of individual of the channel-material strings and the conductor material of the conductor tier. An example manner of doing so is described with reference to FIGS. 9-16.

Figure 9:
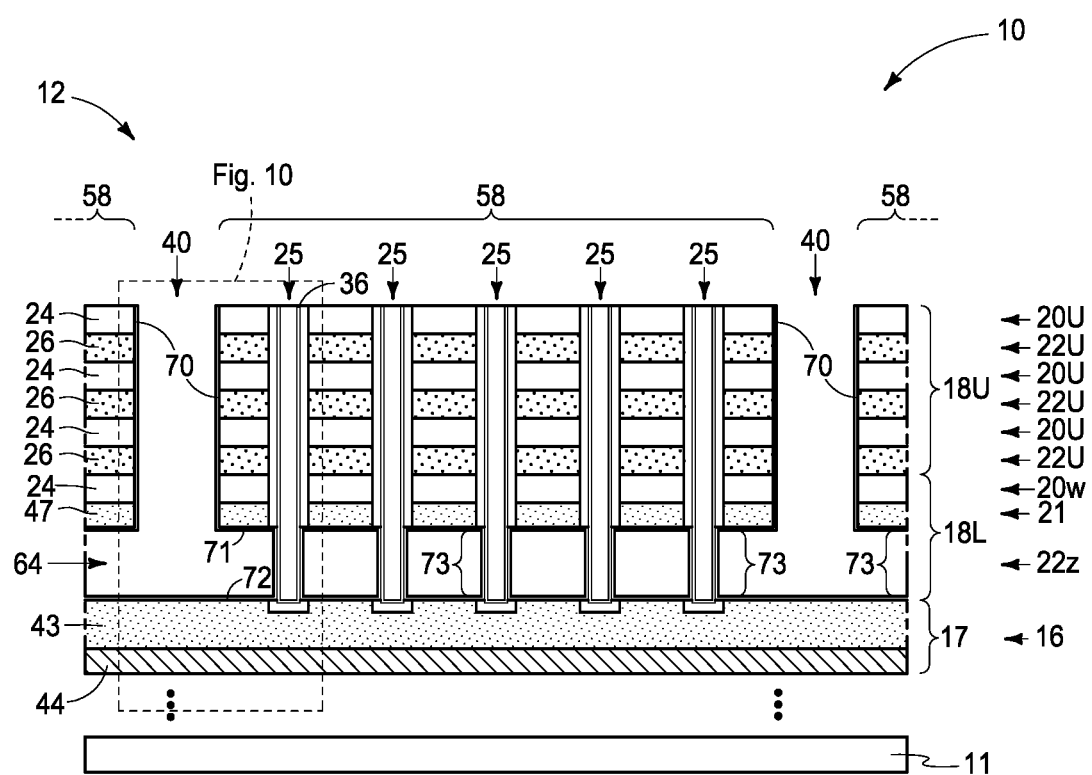
Figure 10:
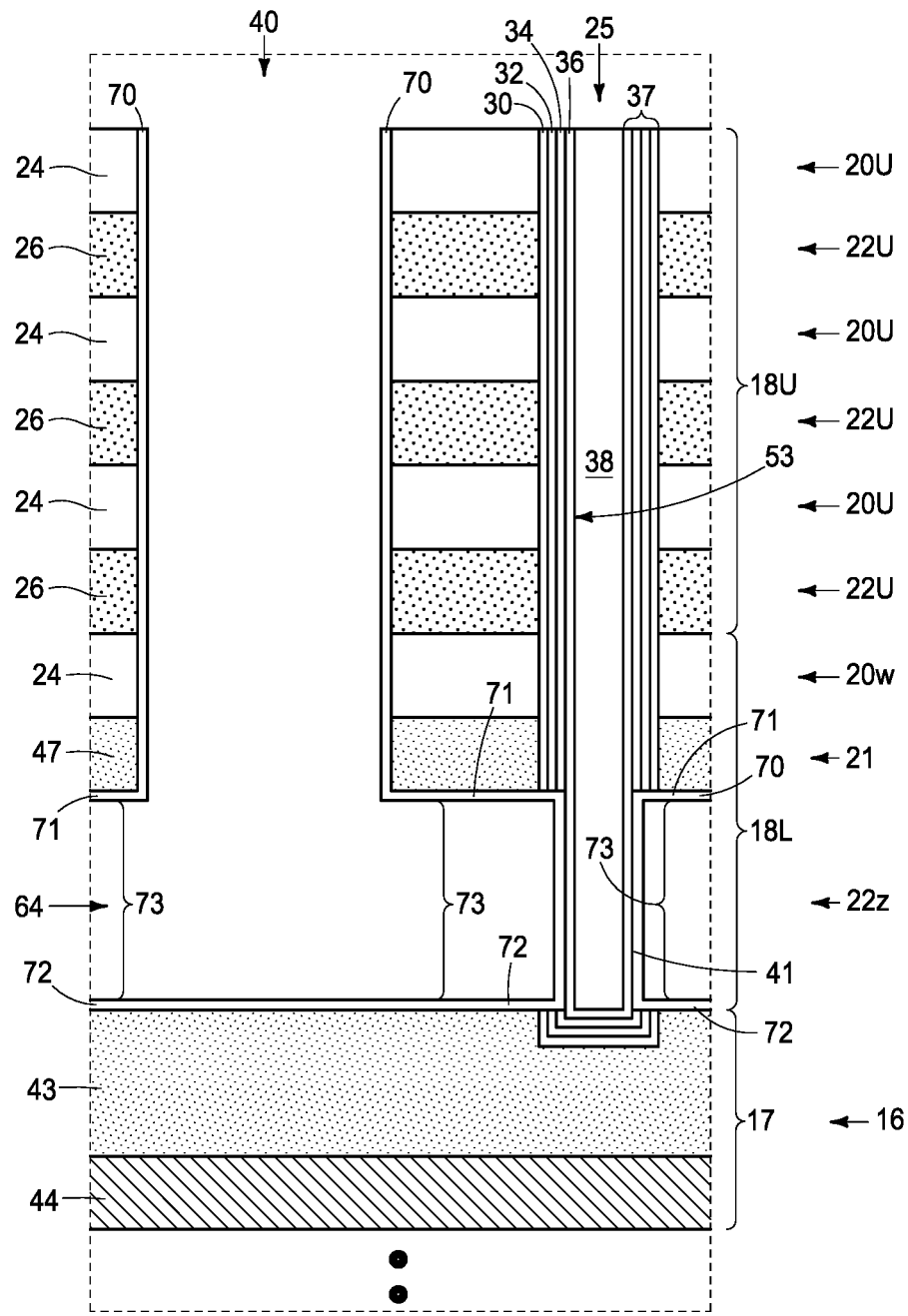

Referring to FIGS. 9 and 10, and in one embodiment, undoped semiconductive material 70 (e.g., comprising polysilicon) has been formed in lowest first tier 22z against channel material 36 of individual channel-material strings 53 (e.g., directly there-against; e.g., against sidewall 41; e.g., directly against sidewall 41). Undoped semiconductive material 70 comprises an upper portion 71 and a lower portion 72 having a void-space 73 vertically there-between. Undoped semiconductive material 70 (i.e., as respects "undoped") has total concentration of all conductivity-modifying dopant therein of 0 atomic percent to less than 0.01 atomic percent, in one such embodiment greater than 0 atomic percent, and in one such latter embodiment at least $1 \times 10^7$ atoms/cm$^3$.

Figure 11:
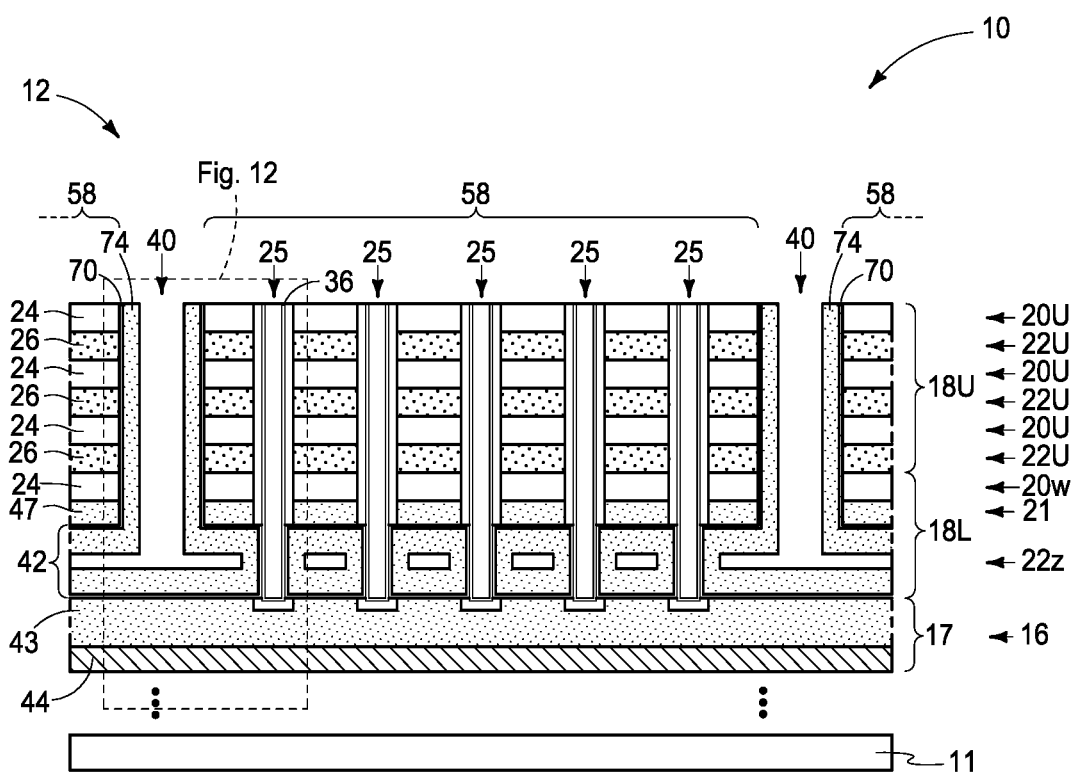
Figure 12:
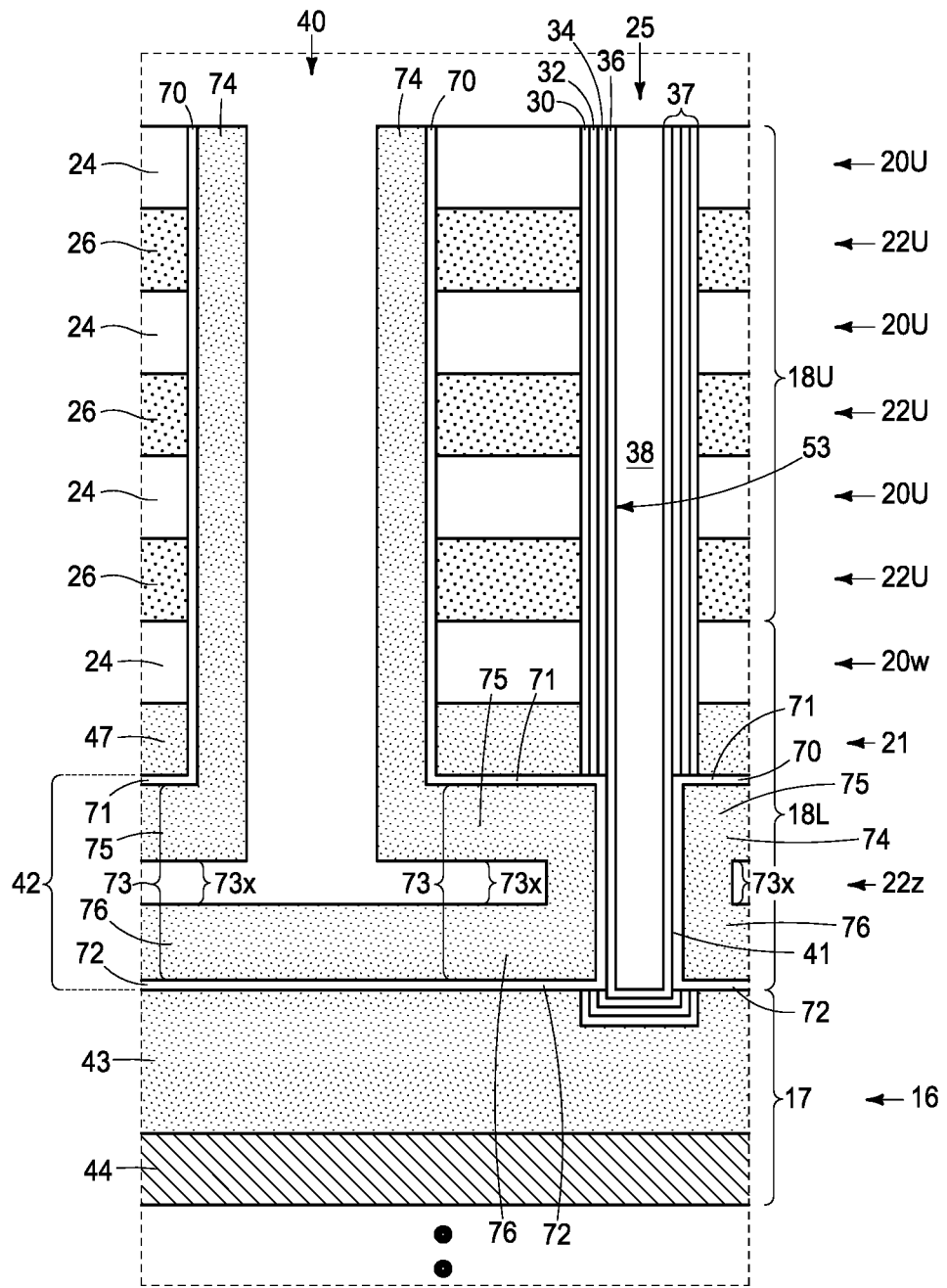

Referring to FIGS. 11 and 12, conductively-doped semiconductive material 74 (e.g., comprising polysilicon) has been formed in void-space 73 and in one such embodiment directly against undoped semiconductive material 70. Conductively-doped semiconductive material 74 comprises an upper portion 75 and a lower portion 76 having a remaining portion 73x of void-space 73 vertically there-between. Conductively-doped semiconductive material 74 has total concentration of all conductivity-modifying dopant therein of 0.01 atomic percent to 30 atomic percent (e.g., no greater than $1\times10^{23}$ atoms/cm$^3$). In one embodiment, conductively-doped semiconductive material 74 is not formed directly against channel material 36 (e.g., as shown). In another embodiment, conductively-doped semiconductive material 74 is formed directly against channel material 36 (not shown; e.g., due to presence of material 70). In one embodiment, upper portion 71 and lower portion 72 of undoped semiconductive material 70 are each thinner than upper portion 75 and lower portion 76 of conductively-doped semiconductive material 74. In one embodiment, total concentration of dopant in undoped semiconductive material 70 is greater than 0 atomic percent and the dopant in conductively-doped semiconductive material 74 are the same composition dopant (e.g., phosphorus if n-type).

Figure 13:
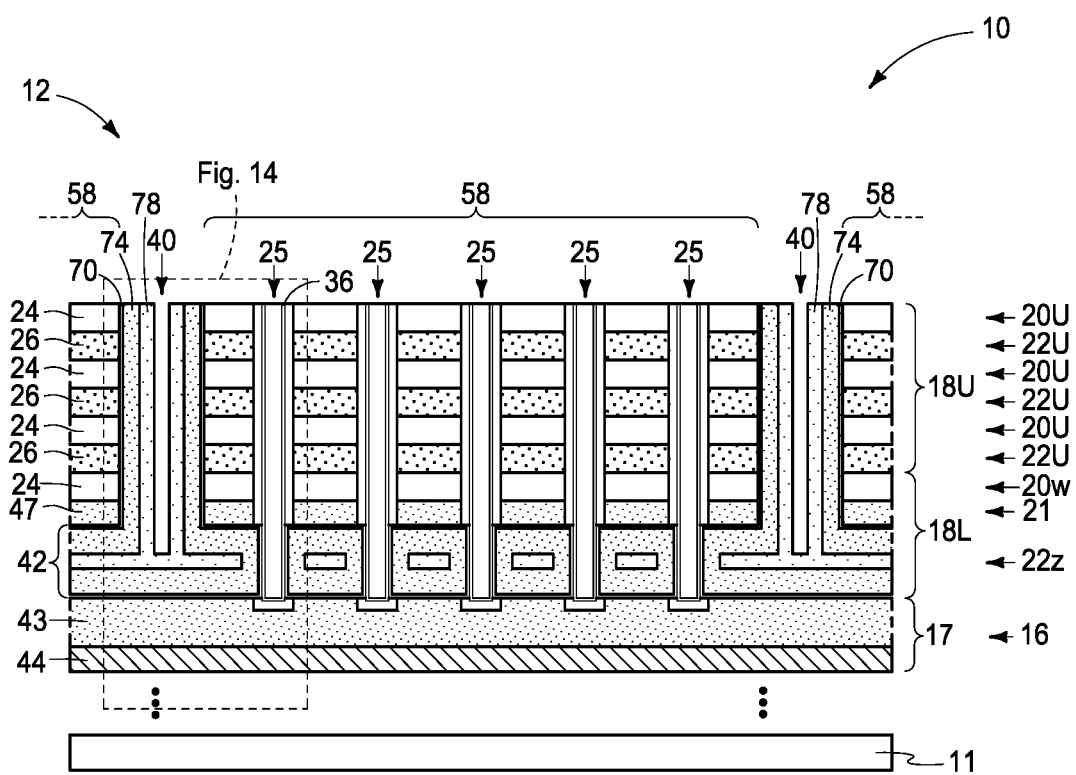
Figure 14:
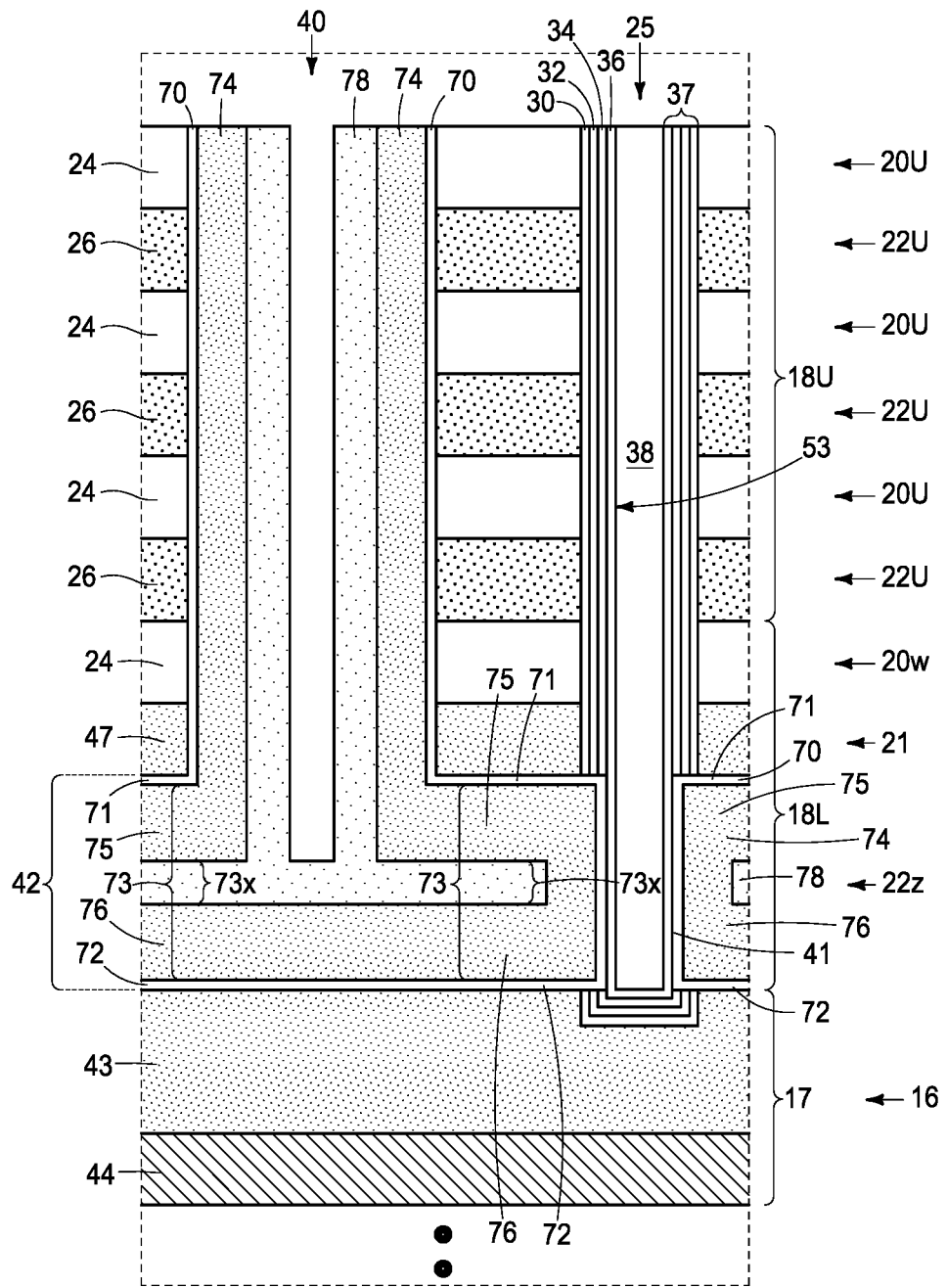

Referring to FIGS. 13 and 14, intermediate material 78 (e.g., comprising polysilicon) has been formed into, and in one embodiment to fill, remaining volume of remaining portion 73x of void-space 73 and in one embodiment directly against conductively-doped semiconductive material 74. Intermediate material 78 is of different composition from that of conductively-doped semiconductive material 74 and comprises at least one of carbon, nitrogen, oxygen, metal (e.g., Ti, W, Co, Ni, Pt, Ru, Mo, Ga), and n-type doped material also comprising boron (n-type dopant in insulative, semiconductive, or conductive material regardless of whether the "n-type doped material" is insulative, semiconductive, or conductive). Different composition as respects intermediate material 78 and conductively-doped semiconductive material 74, at least in a finished-circuitry construction, may only be characterized by presence (or quantity when present) of the at least one of carbon, nitrogen, oxygen, metal, and n-type doped material also comprising boron. Intermediate material 78 may or may not be conductive. For example, if the intermediate material were otherwise intrinsic semiconductive material ignoring any conductivity-increasing dopant that may be therein, the intermediate material may be conductively-doped as formed, semiconductively-doped as formed, or undoped as formed. Yet, such may be conductive in at least the finished circuitry construction if sufficient conductivity-increasing dopant diffuses therein from out-diffusion thereof from conductively-doped semiconductive material 74.

In one embodiment, the at least one comprises carbon, in one embodiment comprises nitrogen, in one embodiment comprises oxygen, in one embodiment comprises the metal (at least one), and in one embodiment comprises the n-type doped material also comprising boron. In one embodiment, the at least one comprises more than one of carbon, nitrogen, oxygen, the metal, and n-type conductively-doped semiconductive material also comprising boron. In one embodiment, all of the at least one is present at $1\times10^{10}$ to $3\times10^{22}$ atoms/cm$^3$, in one such embodiment at at least $1\times10^{14}$ atoms/cm$^3$, and in one such latter embodiment at $5\times10^{19}$ to $5\times10^{21}$ atoms/cm$^3$. In one embodiment, upper portion 71 and lower portion of 72 of undoped semiconductive material 70 are each thinner than intermediate material 78. In one embodiment, intermediate material 78 is thinner than each of upper portion 75 and lower portion 76 of conductively-doped semiconductive material 74.

In one embodiment, materials 70, 74, and 78 comprise conducting material 42 that has been formed in lowest first tier 22z, for example into and through trenches 40, and in one embodiment directly against sidewall 41 of channel material 36. Materials 70 and 78 at least as-deposited may not be intrinsically conductive. Even when not intrinsically conductive and if remaining so in a finished circuitry construction, one or both of such may effectively be or considered as part of conducting material 42 if the one or both is sufficiently thin such that electrical conduction occurs therethrough as a result of such thinness (e.g., forming ohmic contact/connection). Nevertheless, and in one embodiment, annealing of conductively-doped semiconductive material 74 is conducted (e.g., at 100° C. to 500° C. for 5 seconds to 10 minutes or more) sufficient to cause dopant therein to out-diffuse into material 70 and/or 78 to render it/them conductive. Such an anneal may be a dedicated anneal or may inherently occur in subsequent processing towards forming a final circuitry construction. Regardless, and in one embodiment and as shown, conducting material 42 has been formed directly against a bottom of conducting material 47 of conducting tier 21 and directly against a top of upper conductor material 43 of conductor tier 16, thereby directly electrically coupling together channel material 36 of individual channel-material strings 53 with upper conductor material 43 of conductor tier 16 and conducting material 47 of conducting tier 21. In one embodiment as shown, conducting material 47 of tier 21 and conducting material 42 of tier 22z may collectively be considered as the lowest conductive tier at least in array region 12. Yet, intermediate material 78 may not be conductive, with the remaining conducting material 42 (e.g., at least materials 74 and 70 [if present] as qualified as referred to above) being sufficient to directly electrically couple channel material 36 to conductor material 17.

Figure 15:
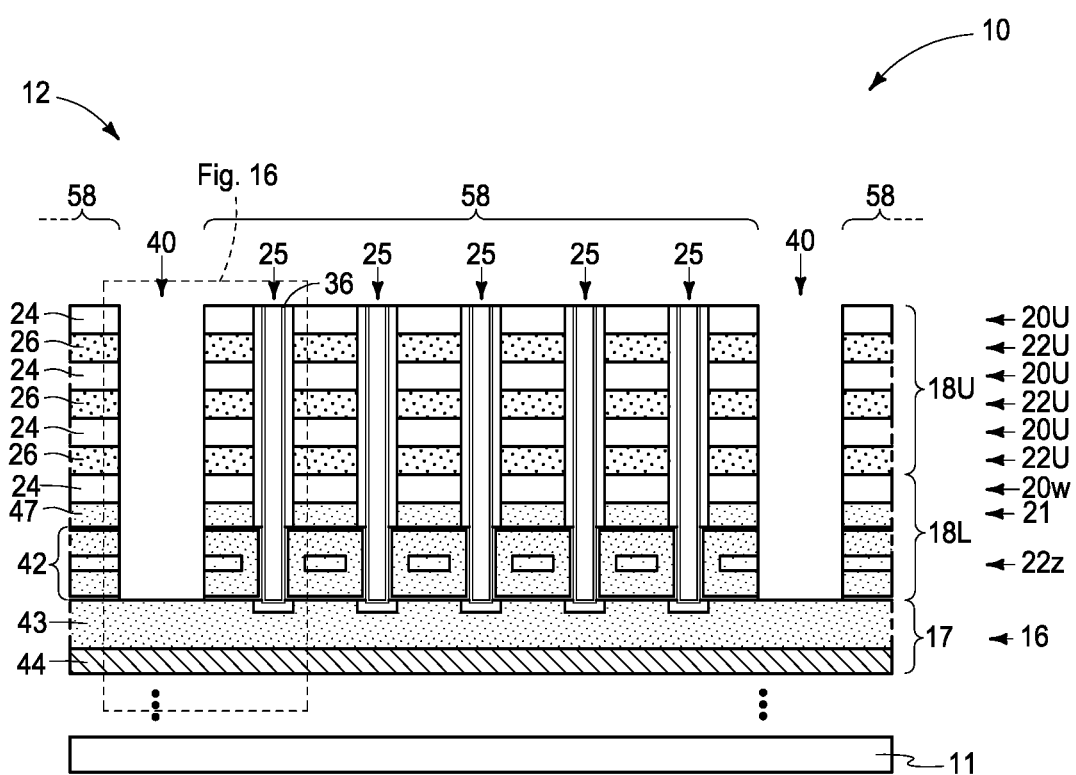
Figure 16:
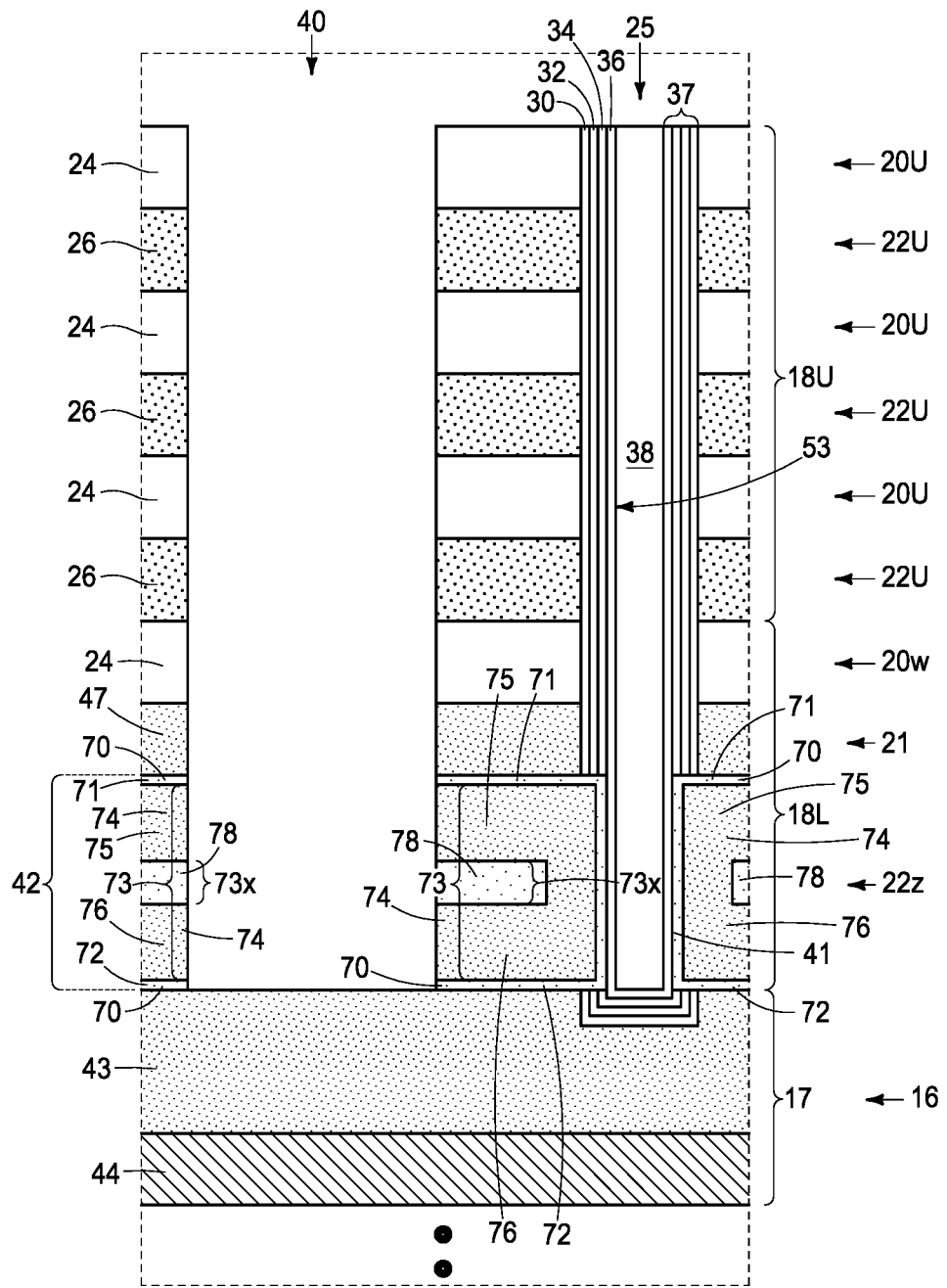
Figure 17:
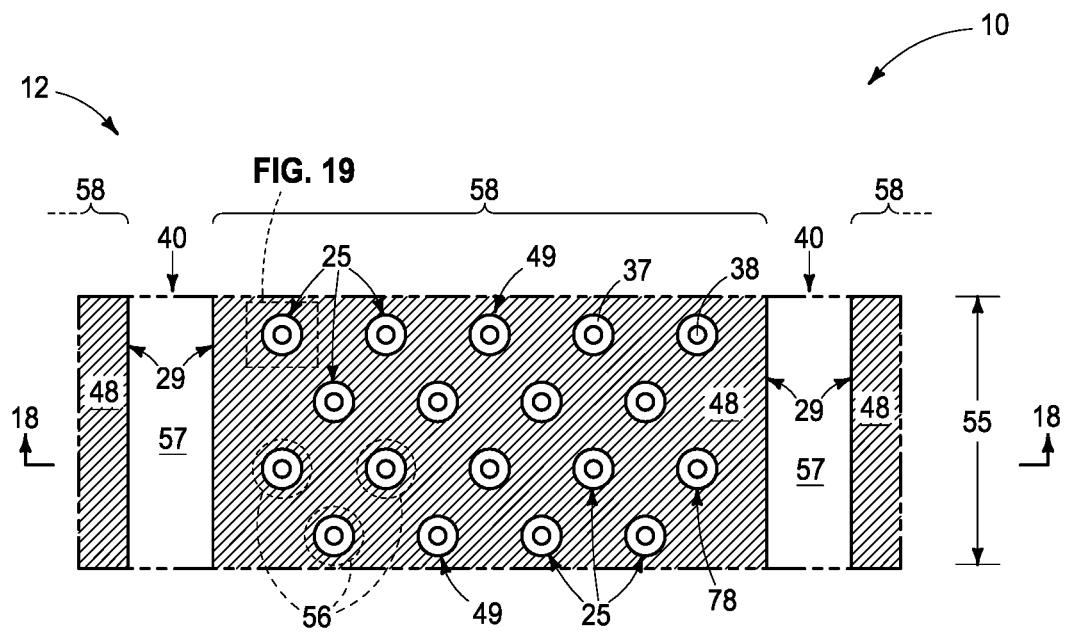
Figure 18:
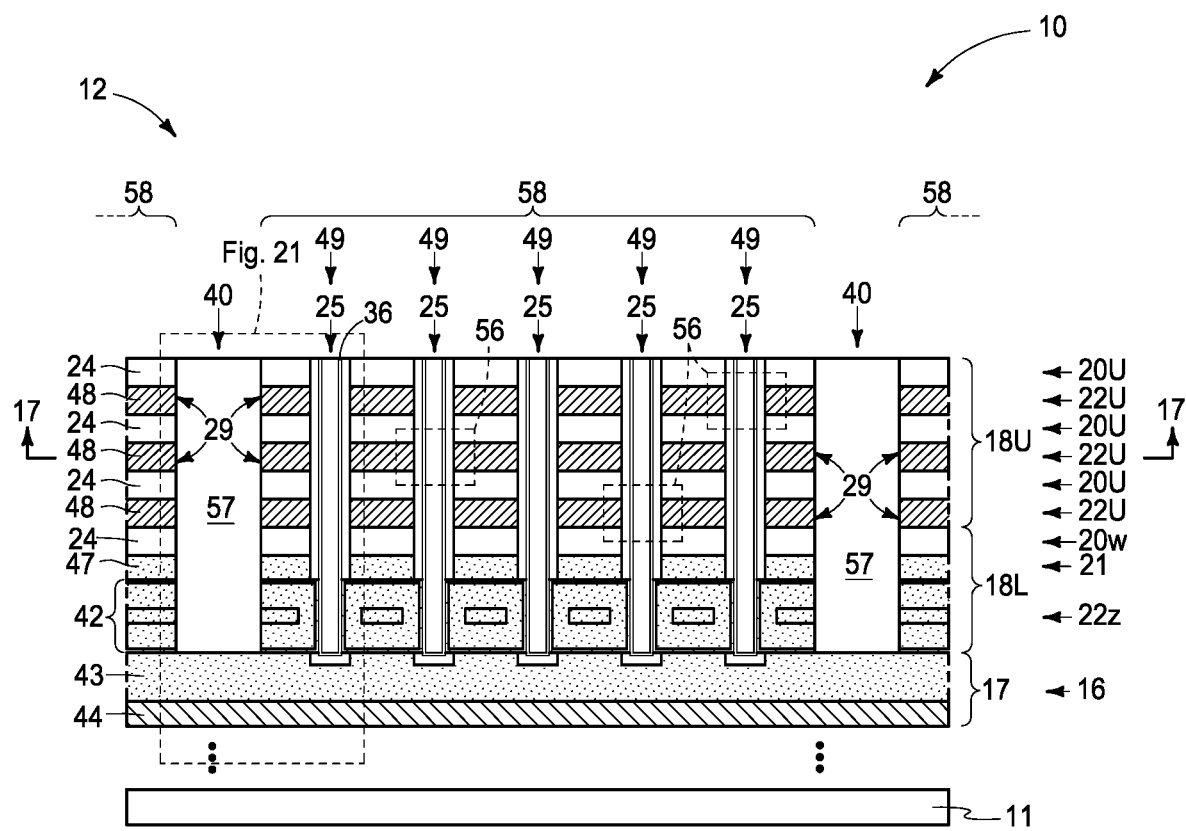
Figure 19:
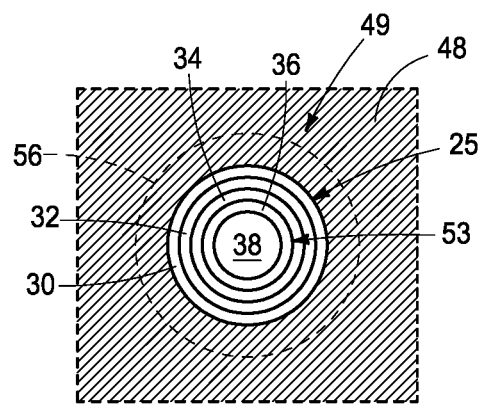
Figure 20:
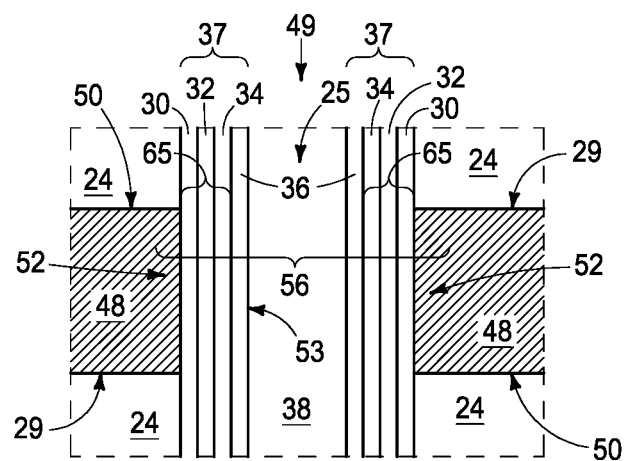
Figure 21:
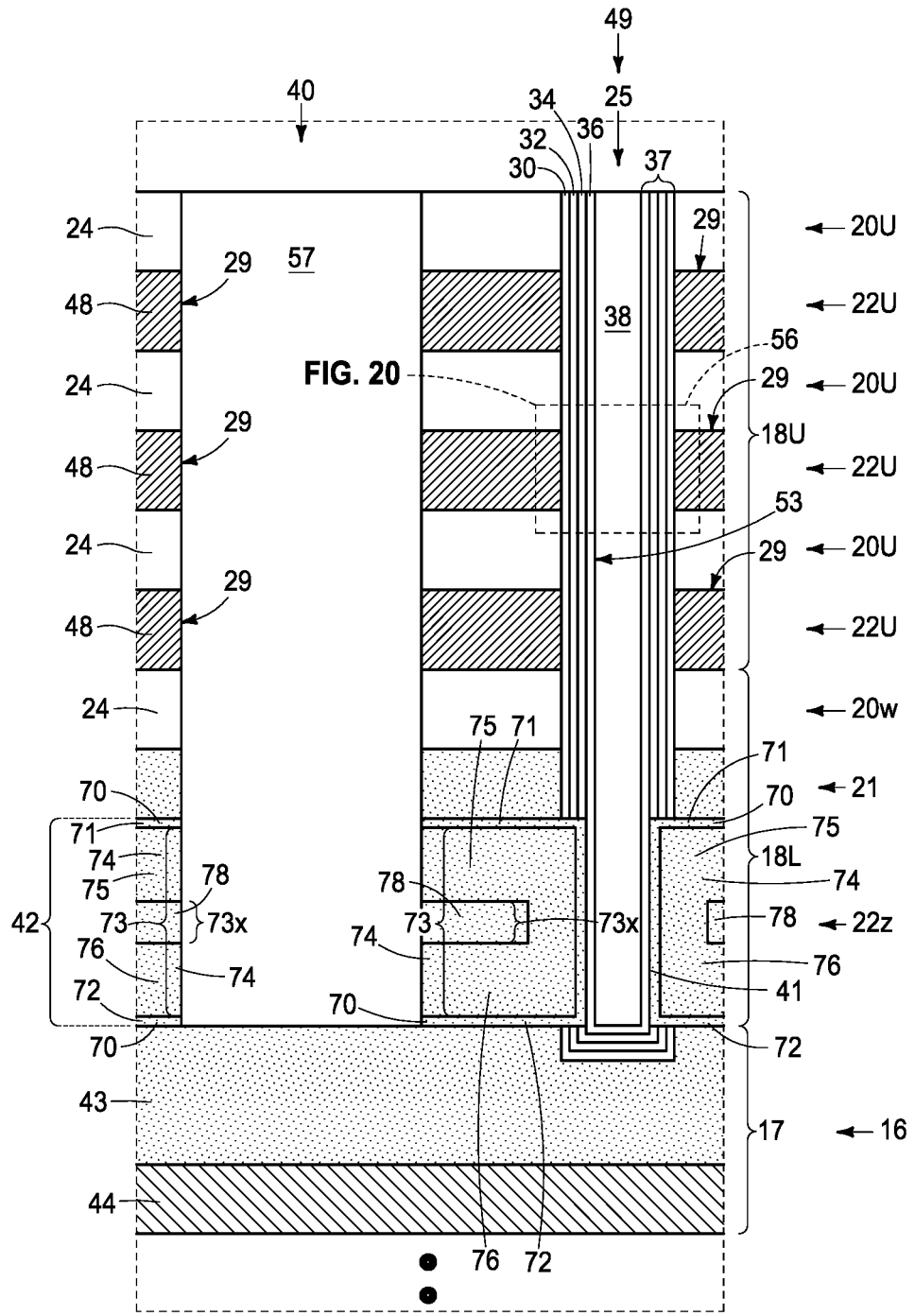

Referring to FIGS. 15 and 16, conducting material 42 has been removed from trenches 40 (e.g., by multiple anisotropic etchings).

Referring to FIGS. 17-21, material 26 (not shown) of conductive tiers 22U has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22U in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29.

Materials 30, 32, and 34 may be considered as a memory structure 65 that is laterally between control-gate region 52 and channel material 36. In one embodiment and as shown with respect to the example "gate-last" processing, conducting material 48 of conductive tiers 22\* is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Intervening material 57 may include through array vias (not shown).

By way of example only, and in one embodiment, materials 70 and 78 are intended to have been indicated to be intrinsically conductive as having the same density stippling as conductively-doped semiconductive material conducting material 42 (e.g., as a result of annealing as describe above).

Any other attribute(s) or aspect(s) as shown and/or described herein with respect to other embodiments may be used in the embodiments shown and described with reference to the above embodiments.

A motivation for the invention was to minimize undesired etching of material 74 that may occur upwardly and downwardly into portions 75 and 76, respectively, in the absence of material 78. Further, presence of undoped semiconductive material 70 (e.g., such at least initially being undoped) may facilitate restricting vertically-upward migration of conductivity-enhancing dopant into channel material 36 the result of pinholes therein.

In one embodiment, a method used in forming a memory array (e.g., 12) comprising strings (e.g., 49) of memory cells (e.g., 56) comprises forming a conductor tier (e.g., 16) comprising conductor material (e.g., 17) on a substrate. Laterally-spaced memory-block regions (e.g., 58) are formed and that individually comprise a vertical stack (e.g., 18\*) comprising alternating first tiers (e.g., 22\*) and second tiers (e.g., 20\*) directly above the conductor tier. Channel-material strings (e.g., 53) extend through the first tiers and the second tiers. Material of the first tiers (e.g., 26) is of different composition from material (e.g., 24) of the second tiers. Conducting material (e.g., 42) is formed in a lower of the first tiers (e.g., 22z) and that directly electrically couples together the channel material (e.g., 36) of individual of the channel-material strings and the conductor material of the conductor tier. The forming of the conducting material comprises forming conductively-doped semiconductive material (e.g., 74) in the lower first tier against the channel material of the individual channel-material strings. The conductively-doped semiconductive material comprises an upper portion (e.g., 75) and a lower portion (e.g., 76) having a void-space (e.g., 73x) vertically there-between. Intermediate material (e.g., 78) is formed into the void-space. The intermediate material is of different composition from that of the conductively-doped semiconductive material and comprising at least one of carbon, nitrogen, oxygen, metal, and n-type doped material also comprising boron. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a conductor tier (e.g., 16) comprising conductor material (e.g., 17). Laterally-spaced memory blocks (e.g., 58) individually comprise a vertical stack (e.g., 18\*) comprising alternating insulative tiers (e.g., 20\*) and conductive tiers (e.g., 22\*) directly above the conductor tier. Channel-material strings (e.g., 53) of memory cells (e.g., 56) extend through the insulative tiers and the conductive tiers. Conducting material (e.g., 42) of a lower of the conductive tiers (e.g., 22z) directly electrically couples together the channel material of individual of the channel-material strings and the conductor material of the conductor tier. The conducting material in the lower conductive tier comprises upper conductively-doped semiconductive material (e.g., 75), lower conductively-doped semiconductive material (e.g., 76), and intermediate material (e.g., 78) vertically there-between. The intermediate material is of different composition from those of the upper conductively-doped semiconductive material and the lower conductively-doped semiconductive material and comprises at least one of carbon, nitrogen, oxygen, metal, and n-type doped material also comprising boron. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a method used in forming a memory array comprising strings of memory cells comprises forming a conductor tier comprising conductor material on a substrate. Laterally-spaced memory-block regions are formed that individually comprise a vertical stack comprising alternating first tiers and second tiers directly above the conductor tier. Channel-material strings extend through the first tiers and the second tiers. Material of the first tiers is of different composition from material of the second tiers. Conducting material is formed in a lower of the first tiers that directly electrically couples together the channel material of individual of the channel-material strings and the conductor material of the conductor tier. The forming of the conducting material comprises forming conductively-doped semiconductive material in the lower first tier against the channel material of the individual channel-material strings. The conductively-doped semiconductive material comprises an upper portion and a lower portion having a void-space vertically there-between. Intermediate material is formed into the void-space. The intermediate material is of different composition from that of the conductively-doped semiconductive material and comprises at least one of carbon, nitrogen, oxygen, metal, and n-type doped material also comprising boron.

In some embodiments, a method used in forming a memory array comprising strings of memory cells comprises forming a conductor tier comprising conductor material on a substrate. Laterally-spaced memory-block regions are formed that individually comprise a vertical stack comprising alternating first tiers and second tiers directly above the conductor tier. Channel-material strings extend through the first tiers and the second tiers. Material of the first tiers is of different composition from material of the second tiers. Conducting material is formed in a lowest of the first tiers that directly electrically couples together the channel material of individual of the channel-material strings and the conductor material of the conductor tier. The forming of the conducting material comprises forming undoped semiconductive material in the lowest first tier directly against a sidewall of the channel material of the individual channel-material strings. The undoped semiconductive material comprises an upper portion and a lower portion having a void-space vertically there-between. The undoped semiconductive material has a total concentration of all conductivity-modifying dopant therein of 0 atomic percent to less than 0.01 atomic percent. Conductively-doped semiconductive material is formed in the void-space directly against the undoped semiconductive material. The conductively-doped semiconductive material comprises an upper portion and a lower portion having a remaining portion of the void-space vertically there-between. The conductively-doped semiconductive material has a total concentration of all conductivity-modifying dopant therein of 0.01 atomic percent to 30 atomic percent. Intermediate material is formed into and fills remaining volume of the remaining portion of the void-space and directly against the conductively-doped semiconductive material. The intermediate material is of different composition from that of the conductively-doped semiconductive material and comprises at least one of carbon, nitrogen, oxygen, metal, and n-type doped material also comprising boron.

In some embodiments, a memory array comprising strings of memory cells comprises a conductor tier comprising conductor material. Laterally-spaced memory blocks individually comprise a vertical stack comprising alternating insulative tiers and conductive tiers directly above the conductor tier. Channel-material strings of memory cells extend through the insulative tiers and the conductive tiers. Conducting material of a lower of the conductive tiers directly electrically coupling together the channel material of individual of the channel-material strings and the conductor material of the conductor tier. The conducting material in the lower conductive tier comprises upper conductively-doped semiconductive material, lower conductively-doped semiconductive material, and intermediate material vertically there-between. The intermediate material is of different composition from those of the upper conductively-doped semiconductive material and the lower conductively-doped semiconductive material and comprises at least one of carbon, nitrogen, oxygen, metal, and n-type doped material also comprising boron.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming a conductor tier comprising conductor material on a substrate;
   forming laterally-spaced memory-block regions individually comprising a vertical stack comprising alternating first tiers and second tiers directly above the conductor tier, channel-material strings extending through the first tiers and the second tiers, material of the first tiers being of different composition from material of the second tiers;
   forming conducting material in a lower of the first tiers that directly electrically couples together the channel material of individual of the channel-material strings and the conductor material of the conductor tier, the forming of the conducting material comprising:
  forming conductively-doped semiconductive material in the lower first tier against the channel material of the individual channel-material strings, the conductively-doped semiconductive material comprising an upper portion and a lower portion having a void-space vertically there-between; and
  forming intermediate material into the void-space, the intermediate material being of different composition from that of the conductively-doped semiconductive material and comprising at least one of carbon, nitrogen, oxygen, metal, and n-type doped material also comprising boron.

2. The method of claim 1 wherein the at least one comprises carbon.

3. The method of claim 1 wherein the at least one comprises nitrogen.

4. The method of claim 1 wherein the at least one comprises the metal.

5. The method of claim 1 wherein the at least one comprises the n-type conductively-doped semiconductive material also comprising boron.

6. The method of claim 1 wherein the at least one comprises more than one of carbon, nitrogen, oxygen, the metal, and n-type conductively-doped semiconductive material also comprising boron.

7. The method of claim 1 wherein all of the at least one is present at $1\times10^{10}$ to $3\times10^{22}$ atoms/cm$^3$.

8. The method of claim 7 wherein all of the at least one is present at at least $1\times10^{14}$ atoms/cm$^3$.

9. The method of claim 8 wherein all of the at least one is present at $5\times10^{19}$ to $5\times10^{21}$ atoms/cm$^3$.

10. The method of claim 1 wherein the conductively doped semiconductive material is not formed directly against the channel material.

11. The method of claim 1 wherein the conductively doped semiconductive material is formed directly against the channel material.

12. The method of claim 1 wherein the conductively doped semiconductive material has total concentration of all conductivity-modifying dopant therein of 0.01 atomic percent to 30 atomic percent.

13. The method of claim 12 wherein the total concentration is no greater than $1\times10^{23}$ atoms/cm$^3$.

14. The method of claim 1 wherein the intermediate material is formed into the void-space directly against the conductively-doped semiconductive material.

15. The method of claim 1 wherein the intermediate material is formed into the void-space to fill such void-space.

16. The method of claim 1 wherein the lower first tier is the lowest of the first tiers.

17. The method of claim 1 wherein the intermediate material is thinner than each of the upper and lower portions of the conductively-doped semiconductive material.

18. The method of claim 1 wherein the intermediate material is conductive at least in a finished circuitry construction.

19. A method used in forming a memory array comprising strings of memory cells, comprising:
  forming a conductor tier comprising conductor material on a substrate;
  forming laterally-spaced memory-block regions individually comprising a vertical stack comprising alternating first tiers and second tiers directly above the conductor tier, channel-material strings extending through the first tiers and the second tiers, material of the first tiers being of different composition from material of the second tiers;
  forming conducting material in a lowest of the first tiers that directly electrically couples together the channel material of individual of the channel-material strings and the conductor material of the conductor tier, the forming of the conducting material comprising:
    forming undoped semiconductive material in the lowest first tier directly against a sidewall of the channel material of the individual channel-material strings, the undoped semiconductive material comprising an upper portion and a lower portion having a void-space vertically there-between, the undoped semiconductive material having total concentration of all conductivity-modifying dopant therein of 0 atomic percent to less than 0.01 atomic percent;
    forming conductively-doped semiconductive material in the void-space directly against the undoped semiconductive material, the conductively-doped semiconductive material comprising an upper portion and a lower portion having a remaining portion of the void-space vertically there-between, the conductively-doped semiconductive material having total concentration of all conductivity-modifying dopant therein of 0.01 atomic percent to 30 atomic percent; and
    forming intermediate material into and to fill remaining volume of the remaining portion of the void-space and directly against the conductively-doped semiconductive material, the intermediate material being of different composition from that of the conductively-doped semiconductive material and comprising at least one of carbon, nitrogen, oxygen, metal, and n-type doped material also comprising boron.

20. The method of claim 19 wherein the upper and lower portions of the undoped semiconductive material are each thinner than the intermediate material.

21. The method of claim 19 wherein the upper and lower portions of the undoped semiconductive material are each thinner than the upper and lower portions of the conductively-doped semiconductive material.

22. The method of claim 19 wherein the intermediate material is thinner than each of the upper and lower portions of the conductively-doped semiconductive material.

23. The method of claim 19 wherein the upper and lower portions of the undoped semiconductive material are each thinner than the intermediate material.

24. The method of claim 19 wherein each of the undoped semiconductive material, the conductively-doped semiconductive material, and the intermediate material comprises polysilicon.

25. The method of claim 19 wherein the at least one comprises carbon.

26. The method of claim 19 wherein the at least one comprises nitrogen.

27. The method of claim 19 wherein the at least one comprises the metal.

28. The method of claim 19 wherein the at least one comprises the n-type conductively-doped semiconductive material also comprising boron.

29. The method of claim 19 wherein all of the at least one is present at $1\times10^{10}$ to $3\times10^{22}$ atoms/cm$^3$.

30. The method of claim 29 wherein all of the at least one is present at at least $1\times10^{14}$ atoms/cm$^3$.

31. The method of claim 30 wherein all of the at least one is present at $5\times10^{19}$ to $5\times10^{21}$ atoms/cm$^3$.

32. The method of claim 19 wherein the intermediate material is conductive at least in a finished circuitry construction.

\* \* \* \* \*